United States Patent
Chen et al.

(10) Patent No.: US 7,075,107 B2
(45) Date of Patent: Jul. 11, 2006

(54) SEMICONDUCTOR WAFER AND MANUFACTURING PROCESS THEREOF

(75) Inventors: Wei-Jung Chen, Hsinchu (TW); Yung-Ching Chang, Hsinchu (TW); Jaw-Shin Huang, Hsinchu (TW); Cheng-Yu Fang, Hsinchu (TW); Chien-Peng Yu, Hsinchu (TW)

(73) Assignee: Advanced Analog Technology, Inc, Hsinchu (TW)

( * ) Notice: Subject to any disclaimer, the term of this patent is extended or adjusted under 35 U.S.C. 154(b) by 0 days.

(21) Appl. No.: 10/841,035

(22) Filed: May 6, 2004

(65) Prior Publication Data

US 2005/0248000 A1    Nov. 10, 2005

(51) Int. Cl.
*H01L 23/58*    (2006.01)

(52) U.S. Cl. .................. 257/48; 257/208; 257/209; 257/620; 257/665

(58) Field of Classification Search .................. 257/48, 257/208, 209, 620, 665; 438/113, 458, 462
See application file for complete search history.

(56) References Cited

U.S. PATENT DOCUMENTS 6,492,666 B1 *  12/2002  Terada et al. ............... 257/202

* cited by examiner

*Primary Examiner*—Thien F. Tran

(57) ABSTRACT

A semiconductor wafer includes a wafer body, a plurality of analog IC dies spacedly and alignedly formed on the wafer body to define a scribe line as a margin formed between each two dies wherein each of the dies has an internal circuit formed therewithin and at least a terminal pad formed along the scribe line, and a conductive arrangement including at least a conductive element formed on the wafer body to electrically connect the terminal pad with the internal circuit of the die in such a manner that when the die is cut off from the wafer body along the scribe line, the terminal pad is cut off from the die so as to keep the internal circuit in the die.

14 Claims, 3 Drawing Sheets

SEMICONDUCTOR WAFER AND MANUFACTURING PROCESS THEREOF

BACKGROUND OF THE PRESENT INVENTION

1. Field of Invention

The present invention relates to semiconductor, and more particularly to a semiconductor wafer and its manufacturing process thereof, wherein the terminal pad is disposed along a scribe line of a semiconductor wafer to enlarge the usage area of the analog IC die.

2. Description of Related Arts

A conventional semiconductor wafer comprises a wafer body and a plurality of dies spacedly formed on the wafer body to define a scribe line as a margin between each two dies. Accordingly, each of the dies, which is also called as an analog IC chip, is an integrated circuit consisting of silicon based substrate.

Before each of the dies is cut into an individual component, a wafer test must be performed to ensure each of the dies is functioning in an optimum condition. Generally, each of the dies comprises a plurality of bond pads and a plurality of terminal pads spacedly formed within the die, wherein the terminal pads can be test pads for measuring the voltage of the die via a measuring tool, such as probe card, or trim pads for trimming the reference voltage of the die and the reference function thereof.

Accordingly, there are two trimming methods, which are laser cut and electrical test, are commonly used for trimming the dies. The laser cut is performed to trim the trim fuse such that the properties of dies are corresponding changed once the trim fuse is cut. However, the operation of the laser cut is costly and complicated so as to highly increase the manufacturing cost of the die. In addition, during the operation of the laser cut, the voltage of each of the dies cannot be predicted so that the quality of each of the dies cannot be standardized.

Another trimming method is preformed by electrical trim, wherein an electric current is applied on each of the dies to trim the trim fuse. Since the electrical current can be selectively controlled, the trim fuses can be selectively removed from the dies so as to generate the reference voltage of the die and the reference function thereof.

Furthermore, the conventional semiconductor wafer has several drawbacks. Since the terminal pads are disposed within each of the dies, the size of the die must be big enough to hold the bond pads, the terminal pads, and the trim fuses in position. Therefore, the limited size of each of the dies can only hold up to a certain number of pads thereon. In other words, the complicated integrated circuits are limited on the size of each of the dies so as to highly increase the manufacturing cost of the semiconductor wafer.

In addition, when the dies are cut off from the semiconductor wafer, the terminal pads are stayed on each of the dies. It is worth to mention that the terminal pads are only used for measuring the voltage of the corresponding die or programming the trim fuse. The terminal pads are useless after the measurement. Therefore, the terminal pads will used up the limited space of each of the dies.

SUMMARY OF THE PRESENT INVENTION

A main object of the present invention is to provide a semiconductor wafer, wherein the terminal pad are disposed along a scribe line of a semiconductor wafer to electrically connect with the die, so as to enlarge the usage area of the die.

Another object of the present invention is to provide a semiconductor wafer, wherein a conductive arrangement is extended from the scribe line to the die for electrically connecting the terminal pad with the die, such that when the die is cut off from the wafer body, the terminal pad is removed from the die by simply cutting off the conductive arrangement along the scribe line.

Another object of the present invention is to provide a semiconductor wafer, wherein the terminal pad is formed as a comb shape to minimize the residue is stayed at the cutting tip of the cutting tool when a cutting tool cuts off the die along the scribe line, so as to enhance the cutting operation of the die.

Another object of the present invention is to provide a semiconductor wafer, wherein since the terminal pad is moved from the die to the scribe line of the wafer body, the usage area of the die is enlarged such that more integrated circuits can be added into the die for enhancing the function of the die.

Another object of the present invention is to provide a semiconductor wafer, wherein no substantial structural design of the die is altered such that the semiconductor wafer can be tested by any existing trimming test, so as to minimize the manufacturing cost of the present invention.

Another object of the present invention is to provide a trim fuse semiconductor wafer, wherein the manufacturing process thereof is as simple as repositioning the terminal pad from the die to dispose along the scribe line of the wafer and electrically connecting the terminal pad with the die via the conductive arrangement. Therefore, no extra component is required in the present invention so as to further lower the manufacturing cost of the present invention.

Accordingly, in order to accomplish the above objects, the present invention provides a semiconductor wafer, comprising:

a wafer body;

a plurality of analog IC dies spacedly and alignedly formed on the wafer body to define a scribe line as a margin formed between each two dies, wherein each of the dies has an internal circuit formed therewithin and at least a terminal pad formed along the scribe line; and a conductive arrangement, comprising at least a conductive element formed on the wafer body to electrically connect the terminal pad with the internal circuit of the die in such a manner that when the die is cut off from the wafer body along the scribe line, the terminal pad is cut off from the die so as to keep the internal circuit in the die.

These and other objectives, features, and advantages of the present invention will become apparent from the following detailed description, the accompanying drawings, and the appended claims.

DETAILED DESCRIPTION OF THE PREFERRED EMBODIMENT

Figure 1:
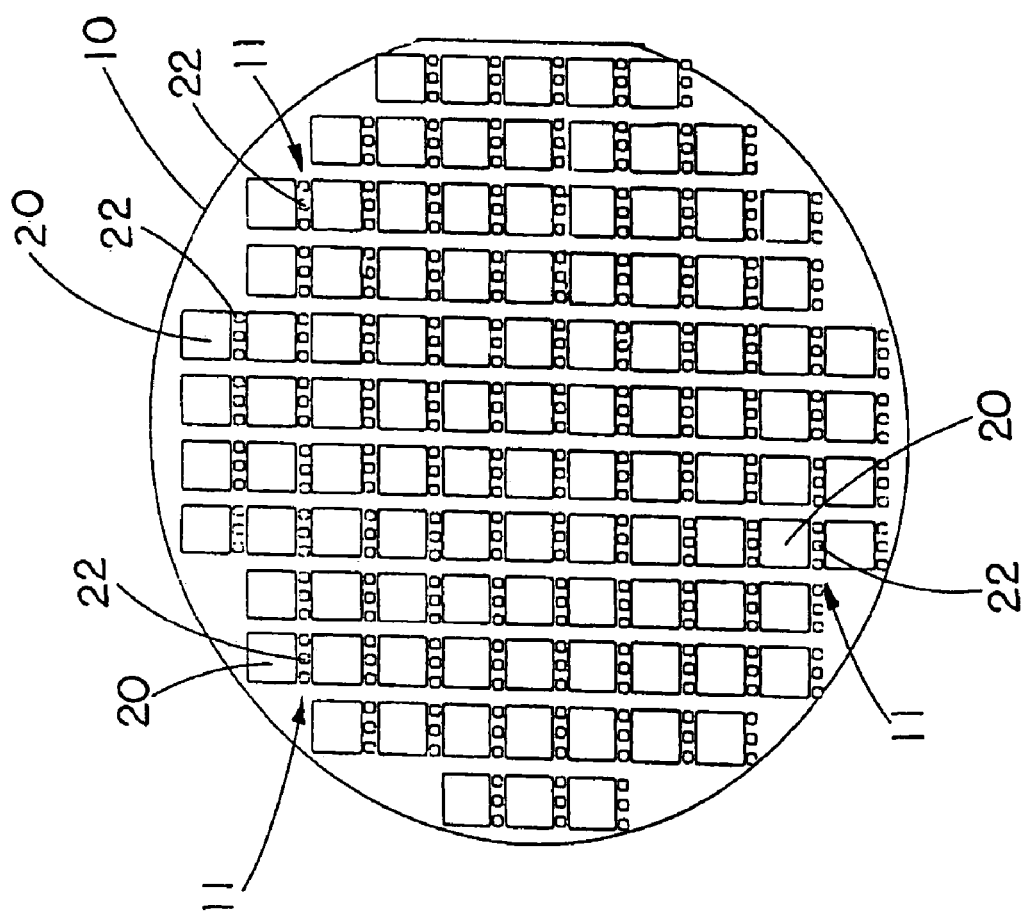
FIG. 1 is a front view of the semiconductor wafer according to the above preferred embodiment of the present invention, illustrating the analogy IC die electrically connected with a terminal pad.
Figure 2:
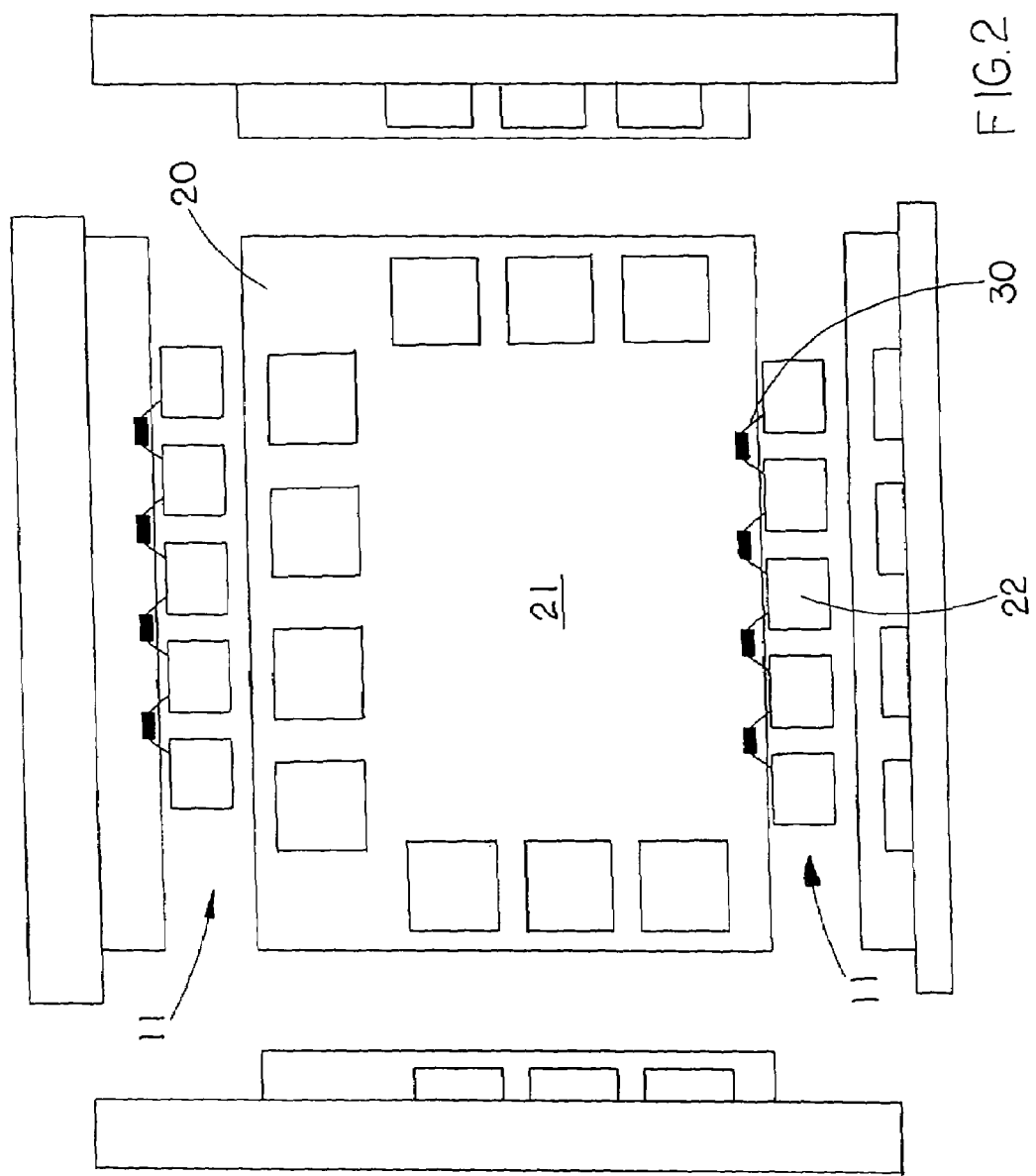
FIG. 2 is a perspective view of an analog IC die electrically connected with a terminal pad on the semiconductor wafer according to the above preferred embodiment of the present invention.

Referring to FIGS. 1 and 2 of the drawings, a semiconductor wafer according to a preferred embodiment of the present invention is illustrated, wherein the semiconductor wafer comprises a wafer body 10, and a plurality of analog IC dies 20 spacedly and alignedly formed on the wafer body 10 to define a scribe line 11 as a margin formed between each two dies 20, wherein each of the dies 20 has an internal circuit 21 formed therewithin and at least a terminal pad 22 formed along the scribe line 11.

The semiconductor wafer further comprises a conductive arrangement 30 which comprises at least a conductive element 31 formed on the wafer body 10 to electrically connect the terminal pad 22 with the internal circuit 21 of the die 20 in such a manner that when the die 20 is cut off from the wafer body 10 along the scribe line 11, the terminal pad 22 is cut off from the die 20 so as to keep the internal circuit 21 in the die 20.

The present invention further provides a process of manufacturing the semiconductor wafer which comprises the following steps.

(1) Spacedly and alignedly form the analog IC dies 20 on the wafer body 10 to define the scribe line 11 as a margin formed between each two dies 20.

(2) Align the terminal pad 22 on the scribe line 11 of the wafer body 10 adjacent to the respective die 20.

(3) Form the conductive element 31 on the wafer body 10 to electrically connect the terminal pad 22 with the internal circuit 21 of the die 20.

(4) Cut off the die 20 from the wafer body 10 along the scribe line 11 thereof such that the terminal pad 22 is removed from the die 20 so as to keep the internal circuit 21 within the die 20.

According to the preferred embodiment, each of the dies 20 is an analog IC that provides an accurate performance. Therefore, the voltage measurement of the each of the dies 20 must be precise. Likewise, each of the dies 20 is trimmed to program the die 20 so as to generate a reference voltage and a reference function.

Each of the dies 20 is constructed by a plurality of integrated circuits electrically connected with each other to form the internal circuit 21 wherein the terminal pad 22 is electrically connected with the internal circuit 21 of the respective die 20 via the conductive element 31.

The terminal pad 22 is embodied as a trim pad electrically extended from of the integrated circuit 21 of the die 20. Accordingly, each of the dies 20 further has a trim fuse 23 electrically extended from the terminal pad 22 such that the respective die 20 is adapted to be trimmed to generate the reference voltage and the reference function of the die 20. Alternatively, the terminal pad 22 can be a test pad for electrically coupling with the measuring tool to measure the voltage of the die 20.

Figure 3:
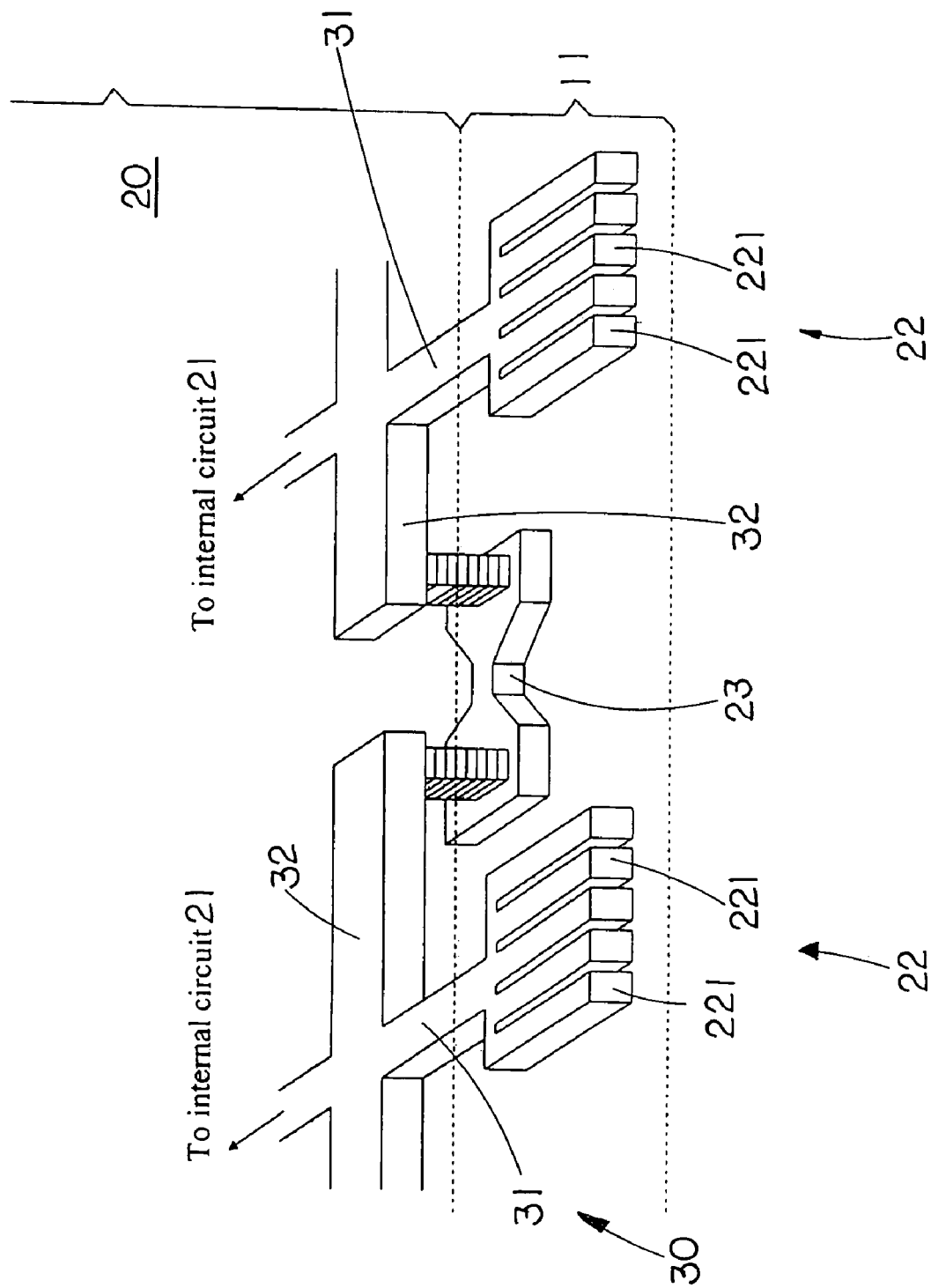
FIG. 3 is a sectional perspective view of the analog IC die electrically connected with a terminal pad on the semiconductor wafer according to the above preferred embodiment of the present invention.

As shown in FIG. 3, the terminal pad 22, having as a comb shaped, defines a plurality of terminal teeth 221 spacedly formed on the scribe line 11 of the wafer body 10, wherein the conductive element 31 is extended from the scribe line 11 of the wafer body 10 to the die 20 so as to electrically connect the terminal teeth 221 of the terminal pad 22 with the internal circuit 21 of the die 20.

In addition, steps (1), (2), and (3) are preformed at the same time such that the analog IC dies 20, the terminal pad 22, and the conductive element 31 are spacedly formed on the wafer body 10.

It is worth to mention that in order to cut off the die 20 from the wafer body 10, a cutting tool, such as a diamond-head cutting device, is employed to cut along the scribe line 11 of the wafer body 10 so as to individually separate the die 20 from the wafer body 10. However, when the cutting tip of the cutting tool slidably cuts along the scribe line 11 of the wafer body 10, residue of the terminal pad 22 will stay at the cutting tip of the cutting tool which has the serrated edge shape. Therefore, in order to prevent the residue of the terminal pad 22 stayed at the cutting tip of the cutting tool, the terminal pad 22 is formed as a comb shape that the spaced apart terminal teeth 221 of the terminal pad 22 are adapted to minimize the residue is stayed at the cutting tip of the cutting tool when the cutting tip thereof slidably cuts along the terminal teeth 221 of the terminal pad 22.

The conductive element 31, which is preferably made of metal layer such as lead, is extended from the scribe line 11 of the wafer body 10 to the die 20 so as to electrically connect the terminal pad 22 with the internal circuit 21 of the die 20. Alternatively, the conductive element 31 can be made of poly layer to electrically connect the terminal pad 22 with the internal circuit 21 of the die 20.

Accordingly, when the terminal pad 22 is embodied as the trim pad, the conductive arrangement 30 further comprises a supplement conductive element 32 electrically extended from the conductive element 32 to the trim fuse 23 such that the trim fuse 23 is adapted to be trimmed by the trim pad of the terminal pad 22 through the supplement conductive element 32. After the die 20 is trimmed, the trim pad of the terminal pad 22 is removed from the die 20, as shown in FIG. 3.

It is worth to mention that the trim fuse 23 is disposed within the die 20 such that the trim fuse 23 is remained in the die 20 after the die 20 is cut off from the wafer body 10. In addition, a portion of the conductive element 31 on the scribe line 11 of the wafer body 10 is removed from the die 20 since the die 20 is cut off from the wafer body 10 along the scribe line 11 thereof.

When the terminal pad 22 is embodied as the test pad, no trim fuse 23 is needed in the die 20, such that the conductive element 32 is extended from the scribe line 11 of the wafer body 10 to the die 20 so as to electrically connect the test pad of the terminal pad 22 with the internal circuit 21 of the die 20. Therefore, after measuring the voltage of the die 20, the test pad of the terminal pad 22 is removed from the die 20.

Accordingly, since the terminal pad 22 is disposed along the scribe line 11 of the wafer body 10, the usage area of the die 20 is substantially enlarged such that more integrated circuits can be added into the die 20 for enhancing the function thereof in comparison with the conventional die that the terminal pad is provided within the die. Furthermore, the terminal pad 22 is used for testing the die 20 when the terminal pad 22 is embodied as the test pad or for trimming the die 20 when the terminal pad 22 is embodied as the trim pad. Therefore, after trimming the die 20 or testing the die 20, the terminal pad 22 does not perform any function for the die 20 such that the terminal pad 22 can be removed from the die 20 while only the internal circuit 21 is kept within the die 20 for operation.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A semiconductor wafer, comprising:

a wafer body;

a plurality of analog IC dies spacedly and alignedly formed on said wafer body to define a scribe line as a margin formed between each two said dies, wherein each of said dies has an internal circuit formed therewithin and at least a terminal pad formed along said scribe line; and a conductive arrangement comprising at least a conductive element formed on said wafer body to electrically connect said terminal pad with said internal circuit of said die in such a manner that when said die is cut off from said wafer body along said scribe line, said terminal pad is cut off from said die so as to keep said internal circuit within said die, wherein said terminal pad, having a comb shaped, defines a plurality of terminal teeth spacedly formed on said scribe line of said wafer body such that said conductive element is extended from said scribe line of said wafer body to said die so as to electrically connect said terminal teeth of said terminal pad with said internal circuit of said die.

2. The semiconductor wafer, as recited in claim 1, wherein said terminal pad is embodied as a test pad formed on said scribe line of said wafer body, wherein said conductive element is extended from said scribe line of said wafer body to said die so as to electrically connect said test pad of said terminal pad with said internal circuit of said die.

3. The semiconductor wafer, as recited in claim 1, wherein said conductive element is made of metal layer.

4. The semiconductor wafer, as recited in claim 1, wherein said conductive element is made of poly layer.

5. The semiconductor wafer, as recited in claim 1, wherein said terminal pad is embodied as a trim pad formed on said scribe line of said wafer body, wherein each of said dies further has a trim fuse disposed therewithin to electrically connect with said trim pad of said terminal pad for trimming said die.

6. The semiconductor wafer, as recited in claim 5, wherein said conductive arrangement further comprises a supplement conductive element electrically extended from said conductive element to said trim fuse such that said trim fuse is adapted to be trimmed by said trim pad of said terminal pad through said supplement conductive element.

7. A semiconductor wafer, comprising:

a wafer body;

a plurality of analog IC dies spacedly and alignedly formed on said wafer body to define a scribe line as a margin formed between each two said dies, wherein each of said dies has an internal circuit formed therewithin and at least a terminal pad formed along said scribe line; and a conductive arrangement comprising at least a conductive element formed on said wafer body to electrically connect said terminal pad with said internal circuit of said die in such a manner that when said die is cut off from said wafer body along said scribe line, said terminal pad is cut off from said die so as to keep said internal circuit within said die, wherein said terminal pad is embodied as a trim pad formed on said scribe line of said wafer body, each of said dies further has a trim fuse disposed therewithin to electrically connect with said trim pad of said terminal pad for trimming said die.

8. The semiconductor wafer, as recited in claim 7, wherein said terminal pad is embodied as a trim pad formed on said scribe line of said wafer body, wherein each of said dies further has a trim fuse disposed therewithin to electrically connect with said trim pad of said terminal pad for trimming said die.

9. The semiconductor wafer, as recited in claim 8, wherein said conductive arrangement further comprises a supplement conductive element electrically extended from said conductive element to said trim fuse such that said trim fuse is adapted to be trimmed by said trim pad of said terminal pad through said supplement conductive element.

10. The semiconductor wafer, as recited in claim 9, wherein said conductive element is made of metal layer.

11. The semiconductor wafer, as recited in claim 9, wherein said conductive element is made of poly layer.

12. The semiconductor wafer, as recited in claim 7, wherein said terminal pad is embodied as a test pad formed on said scribe line of said wafer body, wherein said conductive element is extended from said scribe line of said wafer body to said die so as to electrically connect said test pad of said terminal pad with said internal circuit of said die.

13. The semiconductor wafer, as recited in claim 12, wherein said conductive element is made of metal layer.

14. The semiconductor wafer, as recited in claim 12, wherein said conductive element is made of poly layer.

* * * * *